(12) United States Patent
Sugeta et al.

(10) Patent No.: US 7,579,138 B2
(45) Date of Patent: Aug. 25, 2009

(54) METHOD FOR FORMING MICROPATTERN

(75) Inventors: Yoshiki Sugeta, Kanagawa (JP);
Naohisa Ueno, Kanagawa (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 4 days.

(21) Appl. No.: 11/880,272

(22) Filed: Jul. 19, 2007

(65) Prior Publication Data
US 2008/0020328 A1 Jan. 24, 2008

(30) Foreign Application Priority Data
Jul. 19, 2006 (JP) ............................. 2006-196708

(51) Int. Cl.
G03F 7/00 (2006.01)
G03F 7/004 (2006.01)

(52) U.S. Cl. ................. 430/330; 430/270.1; 430/273.1; 430/311; 430/325

(58) Field of Classification Search ............ 430/273.1, 430/330, 311, 270.1, 325
See application file for complete search history.

(56) References Cited

U.S. PATENT DOCUMENTS

| 3,895,949 | A | * | 7/1975 | Akamatsu et al. | 430/275.1 |
| 5,750,312 | A | * | 5/1998 | Chandross et al. | 430/273.1 |
| 6,033,134 | A | * | 3/2000 | Maruyama et al. | 396/611 |
| 6,451,510 | B1 | * | 9/2002 | Messick et al. | 430/311 |
| 6,566,040 | B1 | * | 5/2003 | Sugino et al. | 430/313 |
| 6,811,817 | B2 | * | 11/2004 | Sugeta et al. | 427/256 |
| 2003/0096903 | A1 | | 5/2003 | Sugeta et al. | |
| 2004/0137377 | A1 | | 7/2004 | Shinbori et al. | |
| 2005/0245663 | A1 | | 11/2005 | Sugeta et al. | |

FOREIGN PATENT DOCUMENTS

| JP | 1-307228 | 12/1989 |
| JP | 4-364021 | 12/1992 |
| JP | 5-166717 | 7/1993 |
| JP | 5-241348 | 9/1993 |
| JP | 2003-107752 | 4/2003 |
| JP | 2003-142381 | 5/2003 |
| JP | 2005-316239 | 11/2005 |

* cited by examiner

Primary Examiner—Amanda C. Walke
(74) Attorney, Agent, or Firm—Knobbe, Martens, Olson & Bear, LLP

(57) ABSTRACT

The present invention provides a method for forming a micropattern, enabling to narrow intervals between resist patterns, in which the narrowing extent of intervals between resist patterns can be increased while maintaining the controllability of resist pattern dimensions and the good resist pattern shape within a wafer face. The present invention relates a method for forming a micropattern comprising: a coating film formation process for applying a coating composition to form a coating film on a substrate having a resist pattern; a first heating treatment process for heat-treating the coating film; a coating film removal process for removing the coating film after the first heating treatment process; and a second heat treatment process for heat-treating the pattern narrowed after the coating film removal process.

4 Claims, 1 Drawing Sheet

METHOD FOR FORMING MICROPATTERN

This application is based on and claims the benefit of priority from Japanese Patent Application No. 2006-196708, filed on 19 Jul. 2006, the content of which is incorporated herein by reference.

BACKGROUND OF THE INVENTION

1. Field of the Invention

The present invention relates to a method for forming a micropattern in the technical field of photolithography, more specifically to a method for forming a micropattern capable of dealing with integration and miniaturization of semiconductor devices in recent years.

2. Related Art

In the production of electronic components such as semiconductor devices and liquid crystal devices, photolithographic techniques have been used when a substrate is subjected to an etching treatment, etc. The photolithographic technique includes processes of: forming a coating film (photoresist layer) on a substrate using a so-called radio-sensitive photoresist responsive to the active radiation; then selectively irradiating the photoresist layer with the active radiation for exposure; performing a developing treatment to selectively dissolve and remove the photoresist layer so as to form an image pattern (photoresist pattern), and, with this pattern as a protective layer (mask pattern), forming various patterns including contact patterns such as a hole pattern, and a trench pattern on the substrate.

With a recent growing tendency to integrate and miniaturize semiconductor devices, micro-fabrication in the formation of these patterns has also advanced, and at present ultrafine processing for a pattern width less than 0.20 μm is demanded. As an active light used in the mask pattern formation, light waves of an excimer laser such as KrF, ArF and $F_2$, as well as short wavelength irradiating lights such as electron beam and EUV (extreme ultraviolet radiation), are utilized. Therefore, research and development of photoresist materials as a mask pattern forming material having properties corresponding to these irradiated lights are performed.

In view of not only the abovementioned photoresist materials, but also pattern formation methods, research, and development of techniques have been performed in order for the pattern micro-fabrication to exceed the resolution limit of conventional photoresist materials.

For example, in a method for forming a micropattern disclosed in Japanese Unexamined Patent Application No. H5-166717, a trimming pattern is formed in a resist for pattern formation that has been coated on a substrate, and after applying a resist for generation of mixing which will mix with the pattern to the entire surface of the substrate, the resist is baked to form a mixing layer from a sidewall to the surface of the resist for pattern formation; followed by removing the non-mixing portion of the resist for generation of mixing so as to attempt to achieve the micro-fabrication of a pattern corresponding to the mixing layer dimension. Furthermore, in a method for forming a micropattern disclosed in Japanese Unexamined Patent Application No. H5-241348, micro-fabrication of a pattern in a certain thickness dimension is attempted by coating a resin which will become insoluble in the presence of an acid on a substrate on which a resist pattern containing an acid-generator was formed; followed by heat-treating to allow the acid to diffuse from the resist to the resin thereby forming a resist of a certain thickness near the interface between the resin and resist pattern; and developing the resist to remove the resinous portion to which the acid has not diffused.

However, since it is difficult to maintain the temperature uniformly within a wafer face in conventionally used heating apparatuses in semiconductor device production according to the methods disclosed in Japanese Unexamined Patent Application Nos. H5-166717 and H5-241348, the thermal dependency of a layer formed on the resist pattern within the wafer face becomes as large as 10 nm/° C., so as to cause a significant problem of pattern dimension unevenness. Furthermore, problems are likely to be caused such as the generation of defects due to a layer formed on the resist pattern and cracks of the layer itself.

On the other hand, a method for micro-fabricating a pattern dimension by fluidizing the resist pattern by the heat-treatment, and so on, has been also known. For example, in Japanese Unexamined Patent Application No. H1-307228, a method is disclosed for forming a micropattern by forming a resist pattern on a substrate, followed by heat-treatment thereof to deform the cross-sectional shape of the resist pattern. Furthermore, in Japanese Unexamined Patent Application No. H4-364021, a method is disclosed for forming a micropattern by forming a resist pattern, followed by heating to fluidize it so as to alter the pattern dimension.

However, in the methods described in Japanese Unexamined Patent Application Nos. H1-307228 and H4-364021, although thermal dependency of the aforementioned resist pattern within a wafer face is as low as about several nm/° C., not only shape deterioration (to become non-rectangular shape) of the resist pattern is observed, but also it is difficult to control the flow level of resist, causing a problem of a difficulty in achieving a uniform narrowing extent of resist pattern within the wafer face.

As a technique to solve these problems in the prior arts, in Japanese Unexamined Patent Application Nos. 2003-107752, 2005-316239 and 2003-142381, the present applicants proposed a coating agent for pattern miniaturization and a technique related to the method for forming a micropattern. With these methods, it has become possible to obtain micropatterns having controllability of the narrowing extent of the resist pattern, an excellent profile, and a property required in semiconductor devices.

In the micropattern forming technique using this coating agent for pattern miniaturization, a photoresist layer is first formed on a substrate, followed by exposing and developing this layer to form a photoresist pattern. Then, after a coating agent for pattern miniaturization is applied over the entire surface of the substrate, the coated substrate is heat-treated so as to widen the photoresist pattern in width through the shrinkage by heat of the coating agent for pattern miniaturization. As a result, the intervals of photoresist pattern are narrowed, and the widths of patterns (various patterns such as hole patterns and trench patterns) defined by intervals of photoresist patterns are also narrowed, thereby obtaining a fine pattern.

Furthermore, Japanese Unexamined Patent Application, First Publication No. 2003-142381 describes a method for forming micropatterns in which the pattern micro-fabrication is repeated several times using the aforementioned coating agent for pattern miniaturization.

However, by way of the coating agent for pattern miniaturization and the method for forming micropatterns described in Japanese Unexamined Patent Application, First Publication Nos. 2003-107752 and 2005-316239, the extent of narrowing of the resist pattern is insufficient. Furthermore, in the method for forming micropatterns described in Japanese Unexamined Patent Application, First Publication No. 2003-142381, not only was it necessary to repeat the same treatment several times in order to obtain a desired dimension of micropatterns, problems of product yield were caused, and also the narrowing extent of the resist pattern is limited.

SUMMARY OF THE INVENTION

The present invention has been made in view of the above-described problems. An object of this invention is to provide a method for forming a micropattern, which is not only superior in the controllability of pattern dimensions, but also has a good profile and is capable of increasing the narrowing and miniaturizing extents thereof compared with the conventional pattern miniaturization method, by subjecting the resist pattern to a certain heat treatment to narrow and miniaturize resist pattern intervals.

In order to solve the aforementioned problems, the present inventors actively pursued research. As a result, they found out that the abovementioned problems can be solved by applying a coating composition to form a coating film on the resist pattern, heat-treating the coating film to shrink, simultaneously narrowing intervals between resist patterns, then removing the heat-treated coating film, and further heat-treating the resist film to shrink, thereby achieving the completion of the present invention.

More specifically, the present invention provides a method for forming a micropattern including: a coating film formation process for applying a coating composition to form a coating film on a substrate having a resist pattern; a first heating treatment process for heat-treating the coating film; a coating film removal process for removing the coating film after the first heating treatment process; and a second heat-treating treatment process for heat-treating the pattern narrowed after the coating film removal process.

According to a method for forming a micropattern of the present invention, intervals between resist patterns are narrowed while maintaining the good resist pattern shape by the action of the first heating treatment process, and the intervals between resist patterns are further narrowed through thermal fluidization of the narrowed pattern by the second heating treatment process after removing the coating film following the first heating treatment process. Therefore, by employing the method for forming a micropattern of the present invention, it is possible to increase the narrowing extent of the intervals between resist patterns while maintaining the controllability of resist pattern dimensions within a wafer face, and the good resist pattern shape, as compared to when only the first or the second heat-treatment process is carried out, or when the first and second heat-treatment processes are performed in reverse order.

Herein below, a method for forming a micropattern of the present invention is described with reference to drawings.

DETAILED DESCRIPTION OF THE INVENTION

The method for forming a micropattern of this invention includes a coating film formation process for applying a coating composition to form a coating film on a substrate having a resist pattern; a first heating treatment process for heat-treating the coating film; a coating film removal process for removing the coating film after the first heating treatment process; and a second heat-treating treatment process for heat-treating the pattern narrowed after the coating film removal process.

Resist Layer Formation Process

Figure 1A:
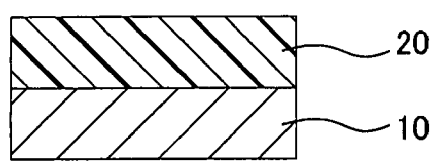
FIG. 1 shows a process chart of a method for forming a micropattern according to an embodiment of the present invention.

FIG. 1A illustrates a process of forming a resist layer, a process of applying a resist composition on a substrate 10, and drying it to form a resist layer 20. Specifically, in the process of forming a resist layer, a resist composition is first applied on a substrate such as a silicon wafer, for example, with a spinner or the like under rotation to form a resist layer.

The substrate is not particularly limited, and any conventionally known substrate can be used, including, for example, a silicon wafer, metals such as copper, chrome, iron and aluminum, as well as glass.

Furthermore, a resist composition is not particularly limited, and any commonly used positive or negative resist composition can be used.

Resist Pattern Formation Process

Figure 1B:
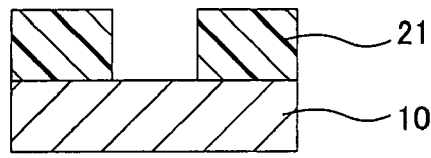

FIG. 1B illustrates a process of forming a resist pattern. The process of forming a resist pattern is one in which, after a pattern is formed by irradiating the active light to a resist layer through a desired mask pattern, or by means of an electron beam, an alkaline development is performed using an alkaline solution such as a 1 to 10% by mass tetramethyl ammonium hydroxide (TMAH) aqueous solution to remove an uncured resist layer so as to form a resist pattern 21.

As a light source for exposure, any radiation may be used including KrF or ArF excimer laser, g-ray and i-ray having longer wavelengths than the excimer laser, and $F_2$ laser, EUV (Extreme Ultra Violet), VUV (Vacuum Ultra Violet), electron beam, X-ray, and soft X-ray having shorter wavelengths than the excimer laser.

Furthermore, production of the substrate having a resist pattern used in the present invention is not particularly limited, and can be carried out by a common method employed in manufacture of a semiconductor device, liquid crystal display device, magnetic head, microlens, etc.

Coating Film Formation Process

Figure 1C:
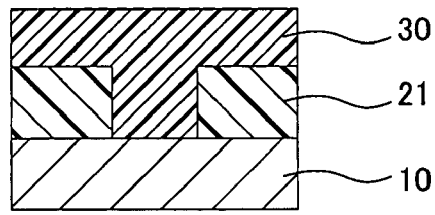

FIG. 1C illustrates a coating film formation process, a process of applying a coating composition on the substrate 10 having the above produced resist pattern 21 to form a coating film 30. Furthermore, after applying the coating composition, the substrate may be pre-baked at a temperature of 80 to 100° C. for 30 to 90 seconds.

The coating film formation process can be carried out by a standard method employed in conventional heat flow process, i.e., by applying an aqueous solution of a coating composition on a substrate using a coating applicator such as a spinner, etc.

Coating Composition to Form Coating Film

The coating composition to form a coating film used in the method for forming a micropattern of the present invention contains a water-soluble polymer as a main component. This water-soluble polymer is not particularly limited so long as it is a resin which is water-soluble at room temperature. Such a water-soluble polymer can be exemplified by at least one selected from a group consisting of alkylene glycol polymers, cellulosic polymers, vinyl polymers, acrylic polymers, urea polymers, epoxy polymers, melamine polymers, and polyamide polymers. A polymer of at least one type of acrylic monomer or a copolymer thereof, or a copolymer of at least one type of acrylic monomer with another monomer are preferable in that intervals of patterns can be efficiently narrowed while maintaining pattern shapes.

Such an acrylic monomer can include acrylic acid, methyl acrylate, methacrylic acid, methyl methacrylate, N,N-dimethylacrylamide, N,N-dimethylaminopropyl methacrylamide, N,N-dimethylaminopropyl acrylamide, N-methylacrylamide, diacetone acrylamide, N,N-diethylaminoethyl methacrylate, N,N-dimethylaminoethyl acrylate, acryloyl morpholine, and the like.

A monomer to be copolymerized with the acrylic monomer includes: a vinyl monomer such as N-vinylpyrrolidone, vinylalcohol, vinylimidazolidinone, and vinylacetate; a cellulosic polymer such as hydroxypropyl methylcellulose phthalate, hydroxypropyl methylcellulose acetatephthalate, hydroxypropyl methylcellulose hexahydrophthalate, hydroxypropyl methylcellulose acetatesuccinate, hydroxypropylmethylcellulose, hydroxypropylcellulose, hydroxyethylcellulose, cellulose acetate hexahydrophthalate, carboxymethylcellulose, ethylcellulose, and methylcellulose; an alkylene glycol monomer such as ethylene glycol, and propylene glycol; a urea polymer being of component such as methylolated urea, dimethylolated urea, and ethylene urea; a melamine monomer such as methoxymethylated melamine, methoxymethylated isobutoxymethylated melamine, methoxyethylated melamine; an epoxy monomer, or a polyamide monomer.

These water-soluble polymers may be used alone, or in any combinations of two or more types thereof. These water-soluble polymers are used as an aqueous solution with a concentration in the range of 3 to 20% by mass, and preferably 5 to 15% by mass.

The coating composition may be further blended with a water-soluble amine compound for adjustment of the narrowing extent of the pattern, pH adjustment, and stability over time of the coating composition, etc. Such water-soluble amine compounds are not particularly limited and acceptable so long as they are water-soluble at room temperature, and preferably has a pKa in the range of 7.5 to 13 in aqueous solution at 25° C. Examples of such amines include: alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanlolamine, N-ethylethanolamine, N-butylethanolamine, N-methyldiethanolamine, monoisopropanolamine, diisopropanolamine, triisopropanolamine and the like; polyalkylene polyamines such as diethylenetriamine, triethylenetetramine, propylenediamine, N,N'-diethylethylenediamine, 1,4-butanediamine, N-ethyl-ethylenediamine, 1,2-propanediamine, 1,3-propanediamine, 1,6-hexanediamine, and the like; aliphatic amines such as 2-ethyl-hexylamine, dioctylamine, tributylamine, tripropylamine, triallylamine, heptylamine, cyclohexylamine, and the like; aromatic amines such as benzylamine, diphenylamine, and the like; cyclic amines such as piperazine, N-methyl-piperazine, methyl-piperazine, hydroxyethyl piperazine, and the like. These water-soluble amines may be used alone, or in any combinations of two or more kinds thereof. Among these water-soluble amines, as a coating composition to form a coating film in particular, one having a boiling point exceeding 140° C. (760 mm Hg) such as monoethanolamine or triethanolamine is preferable.

The blending amount of the water-soluble amine is selected in the range of 0.1% to 30% by mass, and preferably 2% to 15% by mass relative to the water-soluble polymer.

The coating composition may be further blended with a non-amine water-soluble organic solvent as desired for improving the micro-fabrication of pattern dimensions, prevention of defect generation, and so on.

Such non-amine water-soluble organic solvents may be any solvent so long as it is a water miscible non-amine organic solvent, for example, sulfoxides such as dimethylsulfoxide and the like; sulfones such as dimethylsulfone, diethylsulfone, bis(2-hydroxyethyl)sulfone, tetramethylenesulfone, and the like; amides such as N,N-dimethylformamide, N-methylformamide, N,N-dimethylacetamide, N-methylacetamide, N,N-diethylacetamide, and the like; lactams such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone, and the like; imidazolidinones such as 1,3-dimethyl-2-imidazolidinone, 1,3-diethyl-2-imidazolidinone, 1,3-diisopropyl-2-imidazolidinone, and the like; polyvalent alcohols such as ethyleneglycol, ethyleneglycol monomethylether, ethyleneglycol monoethylether, ethyleneglycol monobutylether, ethyleneglycol monomethylether acetate, ethyleneglycol monoethylether acetate, diethyleneglycol, diethyleneglycol monomethylether, diethyleneglycol monoethylether, diethyleneglycol monobutylether, propyleneglycol, propyleneglycol monomethylether, glycerin, 1,2-butylene glycol, 1,3-butyleneglycol, 2,3-butyleneglycol, and derivatives thereof. Among them, in view of the micro-fabrication of pattern dimensions and prevention of defect generation in a pattern, polyvalent alcohols and derivatives thereof are preferred, and glycerin is particularly preferred. Non-amine water-soluble organic solvents can be used alone, or in any combinations of two kinds or more thereof.

When the non-amine water-soluble organic solvent is blended, the blending amount is preferably in the range of 0.1% to 30% by mass, and in particular, 0.5% to 15% by mass.

In view of coating uniformity, in-plane homogeneity and so on, a coating composition may be further blended with a surfactant when required.

To use one having properties such as a high solubility without forming turbidity when added to a copolymer or mixed resin containing a water-soluble polymer except for (poly)methacrylic acid (ester) and (poly)acrylic acid (ester), and miscibility to these polymer components. Use of such a surfactant having these properties enables the effective prevention of defect generation supposedly related to air bubble (microfoam) generation, especially when applying the coating composition for the pattern micro-fabrication.

As an N-alkylpyrrolidone surfactant, a compound represented by the following general formula (1) is preferably used.

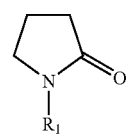

(1)

In the formula, R1 represents an alkyl group having at least 6 carbon atoms.

Specifically, such N-alkylpyrrolidone-based surfactants include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, N-octadecyl-2-pyrrolidone, and the like. Among these, N-octyl-2-pyrrolidone ("SURFADONE LP100", produced by ISP) is preferably used.

As a quaternary ammonium surfactant, a compound represented by the following general formula (2) is preferably used.

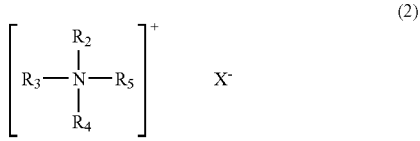

(2)

In the formula, $R_2$, $R_3$, $R_4$ and $R_5$ each independently represent an alkyl group or hydroxyalkyl group (however, at least one thereof represents an alkyl group or a hydroxyalkyl group having at least 6 carbon atoms); and X— represents a hydroxide ion or halogen ion.

Specifically, such quaternary ammonium surfactants include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide, octadecyltrimethylammonium hydroxide, and the like. Among these, hexadecyltrimethylammonium hydroxide is preferably used.

As a polyoxyethylene phosphate-based surfactant, a compound represented by the following chemical formula (3) is preferably used.

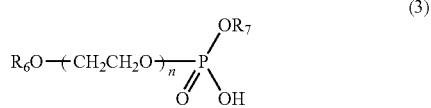

(3)

In the formula, R6 represents an alkyl group or alkylally group having 1 to 10 carbon atoms; R7 represents a hydrogen atom or $(CH_2CH_2O)R6$ (wherein R6 is as defined above); and n represents an integer in the range of 1 to 20.

As such a polyoxyethylene phosphate-based surfactant, specifically, commercial products such as "Plysurf A212E" and "Plysurf A210G" (Dai-ichi Kogyo Seiyaku Co., Ltd.) can be preferably used.

When the surfactant is blended, the blending amount thereof is preferably approximately 0.1% to 10% by mass, and most preferably approximately 0.2% to 2% by mass relative to the coating composition (solid component thereof). By blending the surfactant in such a range, it is possible to effectively prevent problems such as unevenness of the pattern shrinkage ratio associated with a decrease in in-plane uniformity caused by deterioration of coating property, or defect generation supposedly strongly related to air bubbles, referred to as microfoam, generated at the time of application.

Furthermore, a coating composition is preferably used as an aqueous solution having a solid content preferably in the range of 3% to 50% by mass, and most preferably 5% to 30% by mass.

Furthermore, the coating composition, is usually used in the form of an aqueous solution using water as a solvent as described above; however a mixed solvent of water and an alcoholic solvent may also be used. Alcoholic solvents can be exemplified by monovalent alcohols such as methyl alcohol, ethyl alcohol, and isopropyl alcohol. These alcoholic solvents are used by mixing in the range of less than 30% by mass relative to water.

First Heating Treatment Process

Figure 1D:
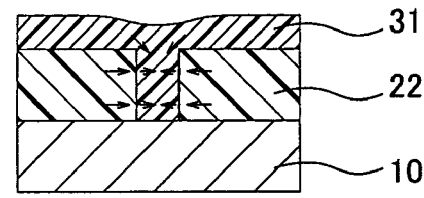

FIG. 1D illustrates a first heating treatment process that is performed at a predetermined heating treatment temperature to heat-shrink the coating film 30 itself, thereby forming a coating film 31 after the first heating treatment process. In this case, due to the action of heat-shrinkage of the coating film 30 itself, intervals of the resist patterns 21 are narrowed. As a result, diameters of hole patterns and interval widths of trench patterns can be narrowed to miniaturize patterns and form the narrowed pattern 22.

The predetermined heating treatment temperature is one enabling the heat-shrinkage of the coating film, and not particularly limited so long as it is a temperature sufficient to carry out the micro-fabrication of patterns. A preferable heating treatment temperature is lower than the thermal softening point of the resist pattern. The thermal softening point of a resist pattern referred to herein means a temperature at which a resist pattern formed on a substrate starts to fluidize naturally when heated, that is, a temperature at which a resist pattern begins thermal flow. The temperature lower than the thermal softening point of the resist pattern indicates a temperature causing no substantial change in dimensions to the resist pattern when a substrate having a resist pattern formed without applying the coating composition is subjected to a heating treatment. When the heat treatment is performed at such a temperature, the resist pattern is pulled by the coating film to narrow intervals of holes and trenches, enabling the formation of narrowed patterns while maintaining a good pattern profile. Furthermore, such a heat treatment is extremely effective in enabling minimization of a duty ratio, that is, a dependence of the heat treatment on pattern intervals, within a wafer face, within the wafer face in particular. In view of the thermal softening points of various resist compositions used in the photolithographic technique at present, a preferable heat treating temperature is usually in the range of 80 to 170° C., but not limited thereto. Furthermore, a heat treating time under such conditions is usually in the range of 30 to 90 seconds.

Coating Film Removal process

Figure 1E:
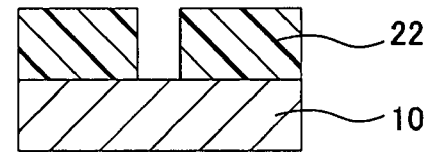

FIG. 1E illustrates a coating film removal process, which is a process of removing the coating film 31 remaining on the narrowed pattern 22 after the first heating treatment process.

The coating film 31 after the first heating treatment process is removed by washing with an aqueous solvent, preferably pure water for 10 to 60 seconds. When required, the coating film may be removed using an alkaline aqueous solution (e.g., tetramethyl ammonium hydroxide (TMAH) aqueous solution, choline aqueous solution, and so on). A coating film formed with the coating composition is easily removed by washing with water, and can be removed completely from the substrate and resist pattern.

Second Heating Treatment Process

Figure 1F:
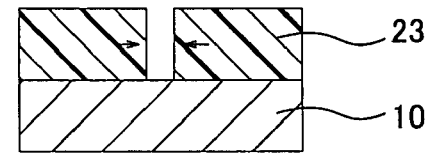

FIG. 1F illustrates a second heating treatment process, which is a process of heating the pattern 22 formed and then narrowed on the substrate to further narrow the pattern, and thereby forming a micropattern 23.

The heating treatment temperature in the second heating treatment process is preferably equal to or higher than the thermal softening point of the pattern 22 formed and narrowed on the substrate. By the second heating treatment process performed at this temperature, the pattern 22 formed and narrowed on the substrate naturally fluidizes, that is, begins to flow. Therefore, hole pattern diameters and trench pattern widths can be narrowed, so that patterns can be further miniaturized. In view of thermal softening points of various resist compositions used in current photolithographic techniques, the heating treatment temperature is preferably in the range of 100 to 200° C., and more preferably 110 to 180° C., but not limited thereto. Furthermore, the heating time is not particularly limited so long as it is in a range not to affect (interfere with) the throughput, and achieves the desired pattern size. Usually, such a heating treatment time is preferably in the range of 30 to 270 seconds, and more preferably in the range of 60 to 120 seconds.

Herein below, the present invention is described in more detail with reference to Examples, but it is not to be construed as being limited thereto.

EXAMPLES

Example 1

A positive photoresist composition "SRK-01" (Tokyo Ohka Kogyo Co., Ltd.) was spin-coated on a substrate having a bottom antireflective coating (BARC) "ARC29" (Brewer Inc.), and baked at 100° C. for 60 seconds to form a resist layer of 480 nm in film thickness. The resist layer was subjected to an exposure treatment using an "NSR-203B" exposure device (Nikon), then to a heating treatment at 110° C. for 60 seconds, and developed using "NMD-3" (Tokyo Ohka Kogyo Co., Ltd.) for 60 seconds to form a hole pattern. This hole pattern had the hole diameter of 182.1 nm and a pitch width between holes of 367.5 nm.

Next, on the substrate with a hole pattern was applied a coating composition having a solid content of 7.5% prepared by dissolving 100 g of a copolymer of acrylic acid and vinyl pirrolidone (polymerization ratio=2:1), 9.0 g of triethanolamine, and 1 g of polyoxyalkylenealkylphenyl ether phosphate-based surfactant "Plysurf A210G" (Dai-ichi Kogyo Seiyaku Co., Ltd.) (1 g) in water, and the coated substrate was heat-treated at 130° C. for 60 seconds to form a coating film, thereby performing micro-fabrication of the hole pattern. The coating film was removed by using pure water. With this first heating treatment process, a hole pattern having a hole diameter of 143.0 nm was obtained.

Next, the hole pattern was subjected to a heating treatment at 135° C. for 90 seconds. By way of the second heating treatment process, a hole pattern having a hole diameter of 99.5 nm was obtained.

More specifically, by the method of the present invention, the initial hole diameter of 182.1 nm could be contracted to 82.6 nm to form a hole pattern having the hole diameter of 99.5 nm. Furthermore, in the hole pattern thus obtained, the verticality of the pattern sidewall was improved, and the verticality of the top of the hole portion was maintained, while roughness of the pattern sidewall was improved.

Comparative Example 1

Using a similar resist composition and substrate, as well as a similar method as in Example 1, a hole pattern having an initial hole diameter of 182.1 nm was formed. The hole pattern was subjected to a heating treatment at 155° C., which is a higher temperature than that in Example 1, for 90 seconds.

As a result, although a hole pattern having the hole diameter of 95.0 nm was obtained, the verticality of the pattern in the cross section of the hole pattern shape thus obtained was diminished, thereby causing a significant hindrance in the subsequent substrate etching process.

Example 2

On a substrate having a bottom antireflective coating film (BARC) "ARC29" (Brewer, Inc.), a positive photoresist composition "STO-244" (Tokyo Ohka Kogyo Co., Ltd.) was spin-coated, and baked at 100° C. for 60 seconds to form a resist layer having a film thickness of 550 nm. The resist layer was subjected to an exposing treatment using an exposure device "NSR-203B" (Nikon), followed by a heating treatment at 110° C. for 60 seconds, and developed using "NMD-3" (Tokyo Ohka Kogyo Co., Ltd.) for 60 seconds to form a hole pattern. Thus formed hole pattern had a hole diameter of 190.0 nm and a pitch width of 385 nm.

Next, onto the substrate having this hole pattern was applied a similar coating composition as that in Example 1, and the substrate was heated at 135° C. for 60 seconds to microfabricate the hole pattern. Subsequently, the coating film was removed by washing with pure water at 23° C.

Next, the hole pattern was heat-treated at 155° C. for 90 seconds to give the hole diameter of this hole pattern being 110.1 nm.

Examples 3 to 9

Hole patterns having the hole diameter and pitch width as shown in Table 1 below were formed by entirely the same method as that in Example 2. Subsequently, by entirely the same method as that in Example 2, micro-fabrication of hole patterns was performed.

Comparative Examples 2 to 8

Micro-fabrication of hole patterns on similar substrates as those in Examples 3 to 9 formed by a similar method as that in Example 2 was performed entirely by the same method as that in Comparative Example 1.

The results of Examples 3 to 9 and Comparative Examples 2 to 8 are shown in Table 1. As shown in Table 1, when the pitch widths between holes were 440 nm or more, almost similar narrowing extents could be observed in both Examples and Comparative Examples. However, with respect to the hole pattern shape, the verticality and roughness of the pattern sidewall were improved while maintaining verticality of the top portion of the hole by using the method of the present invention. In contrast, when the method of Comparative Examples was used, the verticality of the cross section and that of the top portion of the hole top part were diminished, causing a significant hindrance in the subsequent substrate etching process.

TABLE 1

| Pitch width (nm) | 385 | 440 | 550 | 660 | 880 | 1320 | 2440 |
|---|---|---|---|---|---|---|---|
| Hole diameter after development (nm) | 190.0 | 180.1 | 167.8 | 167.5 | 167.2 | 164.6 | 164.2 |

TABLE 1-continued

|  | Example 3 | Example 4 | Example 5 | Example 6 | Example 7 | Example 8 | Example 9 |
|---|---|---|---|---|---|---|---|
| Hole diameter (nm) | 110.1 | 96.2 | 89.2 | 89.1 | 87.2 | 87.7 | 87.4 |
| Narrowing extent (nm) | 79.9 | 83.9 | 78.6 | 78.4 | 80.0 | 76.9 | 76.8 |

|  | Comparative Example 2 | Comparative Example 3 | Comparative Example 4 | Comparative Example 5 | Comparative Example 6 | Comparative Example 7 | Comparative Example 8 |
|---|---|---|---|---|---|---|---|
| Hole diameter (nm) | 113.5 | 96.5 | 85.3 | 85.7 | 84.3 | 84.2 | 84.0 |
| Narrowing extent (nm) | 76.5 | 83.6 | 82.5 | 81.8 | 82.9 | 80.4 | 80.2 |

Examples 10 to 13

Micro-fabrication of a hole pattern was performed by a similar method as that in Example 4, except that the second heating treatment process temperature in Example 3 was changed to 151° C. (Example 10), 153° C. (Example 11), 157° C. (Example 12), and 159° C. (Example 13), respectively.

Comparative Examples 9 to 12

Micro-fabrication of a hole pattern was performed by a similar method as that in Comparative Example 3, except that the heating treatment temperature in Comparative Example 2 was changed to 151° C. (Comparative Example 9), 153° C. (Comparative Example 10), 157° C. (Comparative Example 11), and 159° C. (Comparative Example 12), respectively.

Hole diameters after the micropattern formation are shown in Table 2.

Example 14

A hole pattern was formed by the same method as in Example 1, except that "TARF-P6111" (Tokyo Ohka Kogyo . Co., Ltd.) was used as a positive photoresist composition, and that the film thickness was 250 nm. The hole diameter and pitch width between holes in the hole pattern thus obtained were 140 nm and 280 nm, respectively.

Next, on a substrate having the above hole pattern was applied with a coating composition prepared by dissolving 100 g of a resin comprising acrylic acid, vinyl pyrrolidone and methacrylic acid (polymerization ratio=71.7:23.3:5.0), 6.1 g of triethylamine and 1 g of "Plysurf A210G" (Dai-ichi Kogyo Seiyaku Co., Ltd.), which is a polyoxyalkylenealkylphenyl ether phosphate-based surfactant in water, so as to have a 7.5% solid content, and the coated substrate was heat-treated at 160° C. for 60 seconds to microfabricate the pattern. The

TABLE 2

| Heating treatment process temperature° (C.) | 151 | 153 | 155 | 157 | 159 |
|---|---|---|---|---|---|

|  | Example 10 | Example 11 | Example 4 | Example 12 | Example 13 |
|---|---|---|---|---|---|
| Hole diameter (nm) | 113.7 | 108.4 | 101.3 | 94.5 | 86.7 |

|  | Comparative Example 9 | Comparative Example 10 | Comparative Example 3 | Comparative Example 11 | Comparative Example 12 |
|---|---|---|---|---|---|
| Hole diameter (nm) | 139.1 | 119.5 | 97.0 | 70.1 | 54.3 |

As shown in Table 2, by performing the first heating treatment process followed by the second heating treatment process, it is possible to minimize the fluctuation in the narrowing extents of patterns depending on the temperature change of the heating treatment. The narrowing extent per unit temperature was 3.4 nm/° C. in the Examples, while 11.0 nm/° C. in the Comparative Examples. Therefore, by way of the temperature changes in the heating treatments, it is possible to not only control the patterns more precisely, but also to make the narrowing extent uniform within the wafer face.

hole diameter of the hole pattern thus obtained by this first heating treatment process was 110.5 nm.

Next, when a second heating treatment process was performed at 160° C. for 60 seconds, the hole diameter of the hole pattern thus obtained was 88.9 nm.

Comparative Example 13

When micro-fabrication of a pattern was performed by reversing the order of the first and second heating treatment processes in Example 1, the hole pattern thus obtained was collapsed, so that the pattern dimension was unmeasurable.

While preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. Accordingly, the invention is not to be considered to be limited by the foregoing description and is only limited by the scope of the appended claims.

What is claimed is:

1. A method for forming a micropattern, comprising:
    applying a coating composition to form a coating film on a substrate having a resist pattern;
    heat-treating the coating film to narrow the resist pattern in a first heat treatment;
    completely removing the coating film; and
    heat-treating the pattern narrowed by the first heating treatment in a second heat treatment at a temperature that is higher than a thermal softening point temperature of the narrowed pattern, thereby further narrowing the resist pattern.

2. The method for forming a micropattern according to claim 1, wherein a heating treatment temperature in the first heat treatment is lower than the thermal softening point of the resist pattern.

3. The method for forming a micropattern according to claim 1, wherein the coating composition to form a coating film comprises a water-soluble polymer.

4. The method for forming a micropattern according to claim 3, wherein the coating composition to form a coating film further comprises a water-soluble amine.

* * * * *